(12) United States Patent
Michaluk et al.

(10) Patent No.: US 6,863,750 B2
(45) Date of Patent: Mar. 8, 2005

(54) HIGH PURITY NIOBIUM AND PRODUCTS CONTAINING THE SAME, AND METHODS OF MAKING THE SAME

(75) Inventors: Christopher A. Michaluk, Gilbertsville, PA (US); Louis E. Huber, Jr., Allentown, PA (US)

(73) Assignee: Cabot Corporation, Boston, MA (US)

( * ) Notice: Subject to any disclaimer, the term of this patent is extended or adjusted under 35 U.S.C. 154(b) by 84 days.

(21) Appl. No.: 09/861,879

(22) Filed: May 21, 2001

(65) Prior Publication Data

US 2002/0072475 A1 Jun. 13, 2002

Related U.S. Application Data

(60) Provisional application No. 60/206,159, filed on May 22, 2000.

(51) Int. Cl.$^7$ .............................................. C22C 30/00

(52) U.S. Cl. ....................... 148/668; 148/422; 420/425; 204/298.12

(58) Field of Search ................................ 148/668, 422; 420/425; 204/298.12, 298.13

(56) References Cited

U.S. PATENT DOCUMENTS

| | | | |
|---|---|---|---|
| 2,950,185 A | 8/1960 | Hellier et al. .................. 75/0.5 |
| 3,085,871 A | 4/1963 | Griffiths ...................... 75/34.1 |
| 3,110,585 A | 11/1963 | Scheller et al. .............. 75/84.5 |
| 3,497,402 A | 2/1970 | Douglas et al. ............. 148/11.5 |
| 3,597,192 A | 8/1971 | Wilhelm et al. ................ 75/84 |
| 3,647,420 A | 3/1972 | Restelli ......................... 75/84 |
| 4,149,876 A | 4/1979 | Rerat ..................... 75/0.5 BB |
| 4,231,790 A | 11/1980 | Hahn et al. .................... 75/0.5 |
| 4,619,695 A | 10/1986 | Oikawa et al. ............ 75/65 EB |
| 4,673,554 A | 6/1987 | Niwa et al. .................... 423/63 |
| 4,727,928 A | 3/1988 | De Vynck et al. .......... 164/469 |
| 4,842,706 A | 6/1989 | Fukasawa et al. .......... 204/299 |
| 4,877,445 A | 10/1989 | Okudaira et al. ............. 75/0.5 |
| 4,960,163 A | 10/1990 | Fang et al. .................. 164/459 |
| 5,269,403 A | 12/1993 | Pouliquen et al. .......... 204/298 |
| 5,406,850 A | 4/1995 | Bouchard et al. ............. 73/620 |
| 5,409,548 A | 4/1995 | Hoffman |
| 5,442,978 A | 8/1995 | Hildreth et al. ............... 75/363 |
| 5,522,535 A | 6/1996 | Ivanov et al. ............. 228/122.1 |
| 5,530,467 A | 6/1996 | Ishigami et al. ............. 347/204 |
| 5,573,572 A | 11/1996 | Eckert et al. ............... 75/10.61 |
| 5,590,389 A | 12/1996 | Dunlop et al. ................ 419/67 |
| 5,687,600 A | 11/1997 | Emigh et al. ................... 72/69 |
| 5,693,203 A | 12/1997 | Ohhashi et al. ........ 204/298.12 |
| 5,722,034 A | 2/1998 | Kambara ..................... 419/26 |
| 5,753,090 A | 5/1998 | Obinata .................. 204/298.12 |
| 5,809,393 A | 9/1998 | Dunlop et al. ................ 419/61 |
| 6,348,113 B1 * | 2/2002 | Michaluk et al. ........... 148/668 |
| 2002/0063056 A1 | 5/2002 | Shah et al. ............. 204/298.13 |
| 2002/0132388 A1 | 9/2002 | Rosenberg et al. ........... 438/77 |
| 2002/0153248 A1 | 10/2002 | Shah et al. ............. 204/298.13 |

FOREIGN PATENT DOCUMENTS

| | | | |
|---|---|---|---|
| AU | 252442 | 6/1960 | |
| AU | 252442 | 6/1990 | |
| DE | 04032566 A1 | 10/1990 | |
| DE | 198 41 774 A1 | 9/1998 | |
| EP | 0 590 904 A1 | 9/1993 | |
| EP | 1 099 777 A1 | 6/1999 | |
| EP | 0 281 141 B2 | 6/2000 | |
| GB | 955832 | 4/1964 | |
| JP | 56-145109 | 2/1982 | ........... C01B/31/30 |
| JP | 57-106525 | 10/1982 | ........... C01G/33/00 |
| JP | 59-202624 | 3/1985 | ......... H01L/21/203 |
| JP | 60-124452 | 11/1985 | ........... B22D/13/00 |
| JP | 61-9532 | 6/1986 | ........... C22B/34/24 |
| JP | 61-281831 | 5/1987 | ........... C22B/34/24 |
| JP | 62104180 A | 5/1987 | ........... H01L/39/22 |
| JP | 62-108517 | 10/1987 | ......... H01L/21/203 |
| JP | 62-158118 | 12/1987 | ........... C01G/33/00 |
| JP | S 62-297-463 | 12/1987 | |
| JP | 62-259448 | 4/1988 | ......... H01L/21/316 |
| JP | 62-297463 | 6/1988 | ........... C23C/14/34 |
| JP | 01-73009 | 6/1989 | ............. B22F/9/22 |
| JP | 01-73028 | 6/1989 | ........... C22B/34/20 |
| JP | 01-75632 | 6/1989 | ........... C22B/34/20 |
| JP | 03-082773 | 4/1991 | |
| JP | 03-197640 | 8/1991 | |
| JP | 03-150828 | 9/1991 | ............. H01G/9/04 |
| JP | 03-197640 | 11/1991 | ........... C22C/27/02 |
| JP | 04-2618 | 4/1992 | ........... C01G/35/00 |
| JP | 04-21524 | 4/1992 | ........... C01G/35/00 |
| JP | 6-264232 | 9/1994 | |

(List continued on next page.)

OTHER PUBLICATIONS

Pozdeev, "Reliability Comparison Of Tantalum And Niobium Solid Electrolytic Capacitors", Qual. Reliab. Engng. Int. (1998) 14: 79–82.*

(List continued on next page.)

Primary Examiner—Scott Kastler

(57) ABSTRACT

High purity niobium metals and alloys containing the same are described. The niobium metal preferably has a purity of at least 99.99% and more preferably at least 99.999%. In addition, niobium metal and alloys thereof are described, which either have a grain size of about 150 microns or less, or a texture in which a (100) intensity within any 5% increment of thickness is less than about 30 random, or an incremental log ratio of (111):(100) intensity of greater than about −4.0, or any combination of these properties. Also described are articles and components made from the niobium metal which include, but are not limited to, sputtering targets, capacitor cans, resistive film layers, wire, and the like. Also disclosed is a process for making the high purity niobium metal which includes the step of reacting a salt-containing niobium and a metal salt along with at least one compound capable of reducing the salt-containing niobium to niobium and in a reaction container. The reaction container or liner in the reaction container and the agitator or liner on the agitator are made from a metal material having the same or higher vapor pressure of melted niobium. The high purity niobium product preferably has a fine and uniform microstructure.

81 Claims, No Drawings

FOREIGN PATENT DOCUMENTS

| JP | 2000104164 A | * | 4/2000 | ........... C23C/14/34 |
|---|---|---|---|---|
| WO | WO 87/07650 | | 12/1987 | ........... C23C/14/34 |
| WO | WO 99 61670 | | 12/1999 | |
| WO | WO 99/61670 | | 12/1999 | ........... C22B/34/24 |
| WO | WO 99/66100 | | 12/1999 | ........... C23C/14/34 |
| WO | WO 00 31310 A | | 6/2000 | |

OTHER PUBLICATIONS

Hughes et al., "Grain Subdivision and the Development of Local Orientations in Rolled Tantalum," *The Minerals, Metals & Materials Society*, p. 257–262, (Dec. 1996).

"Tantalum and Tantalum Compounds," *Encyclopedia of Chemical Technology*, vol. 22, Third Edition, p. 541–564, no date.

Lumar et al., "Corrision Resistant Properties of Tantalum," *NACE International*, Paper No. 253, p. 253/1–253/14 (Dec. 1995).

Friedman, "Grain Size Refinement in a Tantalum Ingot," *Metallurgical Transactions*, vol. 2, p. 337–341, Jan. 1971.

"Miller Indices," *Manual of Mineralogy*, 20$^{th}$ Edition, p. 39–40, no date.

Wright et al., Effect of Annealing Temperature on the Texture of Rolled Tantalum and Tantalum–10 Wt.% Tungsten, *Tungsten and Refractory Metals 2*, p. 501–508, no date.

Titterington et al., "The Production and Fabrication of Tantalum Powder," *Symposium on Powder Metallurgy Dec. 1954*, Special Report No. 58, p. 11–18.

Michaluk, "Factors Affecting the Mechanical Properties and Texture of Tantalum," *The Minerals, Metals & Materials Society*, p. 205–217 (Dec. 1996).

Tripp, "The Production of Tantalum by the Sodium Reduction Process," *The Minerals, Metals & Materials Society*, p. 23–27, (Dec. 1996).

Fukang et al., "Tantalum Industry in China," *The Minerals, Metals & Materials Society*, p. 287–292, (Dec. 1996).

Eckert, "The Industrial Application of Pyrometallurgical, Chlorination and Hydrometallurgy for Producting Tantalum Compounds," *The Minerals, Metals & Materials Society*, p. 55–61, no date.

Suri et al., "Studies on Tantalum Extraction," *The Minerals, Metals & Materials Society*, p. 39–46, (Dec. 1996).

Albrecht et al., "Modern Extraction of Tantalum and Niobium With Special Emphasis on the Production of High Purity Compounds," p. 219–240, no date.

Nair et al., "Production of Tantalum Metal by the Aluminothermic Reduction of Tantalum Pentoxide," *Journal of the Less–Common Metals*, vol. 41, p. 87–95, (Dec. 1975).

Klopp, et al., "Purification Reactions of Tantalum During Vacuum Sintering," *Transactions of The Metallurgical Society of AIME*, vol. 218, p. 971–977, Dec. 1960.

Jain et al., "Pilot Plant Production of Capacitor Grade Tantalum Powder," *Transactions of The Indian Institute of Metals*, p. 1–8, Dec. 1971.

Crockett et al., "Niobium (Columbium) and Tantalum," *International Strategic Minerals Inventory Summary Report, U.S. Geological Survey Circular* 930–M, p. 1–36, (Dec. 1993).

Kononov et al., "Electrorefining in Molten Salts—An Effective Method of High Purity Tantalum, Hafnium and Scandium Metal Production," *Journal of Alloys and Compounds* 218, p. 173–176, (Dec. 1995).

Bose et al., "Preparation of Capacitor Grade Tantalum Powder," *Transactions of the Indian Institute of Metals*, p. 1–5, Jun. 1970.

Korinek, "Tantalum—An Overview," *The Minerals, Metals & Materials Society*, p. 3–15, no date.

Burns et al., "Evolution of Applications of Tantalum," *The Minerals, Metals & Materials Society*, p. 273–285, no date.

Jun et al., "Low Temperature Deposition of TaCN Films Using Pentakis (Diethylamido) Tantalum," *Mat. Res. Soc. Symp. Proc. vol. 217, Materials Research Society*, p. 349–354, (Dec. 1996).

Gupta, "Extractive Metallurgy of Niobium, Tantalum, and Vanadium," *International Metals Reviews*, vol. 29, No. 6, p. 405–444, (Dec. 1984).

Hojas, "Radical Forging," *Metals Handbook*, 9$^{th}$ Edition, vol. 14, p. 145–149. (Dec. 1988).

Adams et al., Materials Science Forum, vol. 157–162 (1994), pp. 31–42, no month data.

Adams et al., Metallurgical Transactions A, vol. 24A (Apr. 1993), No. 4, pp. 819–831.

Wright et al., International Academic Publishers, 137 Chaonei Dajie, Beijing (1996), "Textures of Material: Proceedings of the Eleventh International Conference on Textures of Materials", no month data.

Kirk–Othmer, Encyclopedia of Chemical Technology, 3$^{rd}$ Edition, vol. 22, pp. 541–564, no date.

Miller, "Tantalum and Niobium", Butterworths Scientific Publication, Academic Press Inc., New York, 1959, pp. 70–73 and 294–317, no month data.

* cited by examiner ved in the metal or from the atmosphere to form carbon monoxide. The equilibrium concentration of carbon can be estimated for in-situ or atmospheric decarburization as follows, (E. Fromm and H. Jehn, *Met. Trans.*, 3 (1972), pp. 1685–1692 and E. Fromm and H. Jehn, *Z. Metallkd.*, 58 (1968), pp. 65–68, incorporated in their entireties by reference herein).

HIGH PURITY NIOBIUM AND PRODUCTS CONTAINING THE SAME, AND METHODS OF MAKING THE SAME

This application claims the benefit under 35 U.S.C. § 119(e) of prior U.S. Provisional Patent Application No. 60/206,159 filed May 22, 2000, which is incorporated in its entirety by reference herein.

BACKGROUND OF THE INVENTION

The present invention relates to metals, in particular niobium, and products made from niobium metals as well as methods of making and processing the niobium metals.

In industry, there has always been a desire to form higher purity metals for a variety of reasons. With respect to niobium, higher purity metals are especially desirable due to niobium's use as a barrier material for superconductors, as a sputtering source for optical coatings, and for its potential use in electrical components such as capacitors. Furthermore, there is growing interest in high purity niobium-tantalum alloys for use in superconductor filaments, anti-reflective coatings, and possibly as a barrier film for copper interconnects in integrated circuits. Thus, impurities in the metal can have an undesirable effect on the properties and/or the performance of the articles formed from the niobium.

Niobium is found in nature almost exclusively in the form of an oxide (Nb2O5) as columbite ore or as a by-product of the benefaction of tantalum ores. The process used to produce high purity niobium metal typically consists of a chemical extraction and crystallization operation to yield a niobium-bearing ionic salt, a reduction of the ionic salt to produce a niobium metal consolidate, and vacuum melting of the consolidate to produce a high-purity niobium ingot. The vacuum-cast niobium ingot can then be mechanically worked into a variety of mill forms such as sheet, strip, bar, rod, and wire. The high purity niobium ingot and mill forms can also be hydrided, crushed, dehydrided, and subsequently processed to produce niobium powder suitable for capacitor or other powder metallurgy products.

The impurity elements in niobium can be classified as refractory metal impurities, other metallic impurities, and interstitial impurities. Refractory metal impurities include elements such as tantalum, molybdenum, and tungsten; these elements are infinitely soluble in, and have a similar vapor pressure as niobium and cannot be readily removed through vacuum melting. Therefore, refractory metal impurities must be removed prior to or during the niobium consolidation step using methods such as liquid-liquid extraction, fused salt electrolysis, and chemical vapor deposition (CVD) from niobium halides. Other metallic and interstitial impurities can be removed by vacuum melting of niobium. Metallic elements such as alkali, transition, and rare earth metals have higher vapor pressures and are volatized by vacuum melting processes such as Electron Beam (EB) melting, Vacuum Arc Melting (VAM), Vacuum Arc Remelting (VAR), or Electron Beam Float Zone Melting (EBFZM).

Interstitial impurities (nitrogen, oxygen, carbon, and hydrogen) are also removed by vacuum melting, or by annealing the niobium metal at a high annealing temperature in a strong vacuum. Hydrogen typically is readily outgassed from nitrogen at temperatures above about 400° C. in vacuum. Dissolved nitrogen (N) is removed from niobium as diatomic nitrogen (N$_2$); the kinetics of the reaction is a function of the equilibrium concentration of nitrogen in the niobium as determined by Sievert's law, (E. Fromm and G. Hörz, *Intern. Met. Rev.*, 25 (1980), pp. 269–311, incorporated in its entirety by reference herein).

$$c_N = \sqrt{P_{N_2}} \exp(\Delta S_N^0/R) \exp(-\Delta H_N^0/RT)$$

where $$\Delta S_N^0 = -70.3 J/\text{mol} \cdot K \text{ and } \Delta H_N^0 = -178 kJ/\text{mol}$$

Niobium can be decarburized with oxygen either dissolved in the metal or from the atmosphere to form carbon monoxide. The equilibrium concentration of carbon can be estimated for in-situ or atmospheric decarburization as follows, (E. Fromm and H. Jehn, *Met. Trans.*, 3 (1972), pp. 1685–1692 and E. Fromm and H. Jehn, *Z. Metallkd.*, 58 (1968), pp. 65–68, incorporated in their entireties by reference herein).

For in-situ decarburization $$x_{[C]} = \frac{p_{CO}}{p_{O_2}} \exp(-5600/RT - 11.2)$$

For atmospheric decarburization $$x_{[C]} = \frac{p_{CO}}{p_{O_2}^{1/2}} \exp(-12750/RT - 5.30)$$

Typically, carbon is reduced in niobium by assuring that there is a stoichiometric amount or excess of oxygen to completely convert carbon to carbon monoxide. Any remaining oxygen is removed in the form of niobium suboxides by heating at near or above the melting point of niobium within a very high vacuum.

In using a combination of the above-mentioned processes, the ability to produce niobium metal having a purity of 99.999% and better has been demonstrated, (A. Koethe and J. I. Moench, *Mat. Trans., JIM*, 41 No. 1 (2000), pp. 7–16, incorporated in its entirety by reference herein). These or similar methodologies also have been utilized to manufacture tantalum metal having 99.999% purity, (International Application No. WO 87/07650 and European Patent Application No. EP 0 902 102 A1, incorporated in their entireties by reference herein). The ability to produce both high purity niobium and tantalum lends to the creation of techniques for the manufacture of high purity niobium-tantalum alloys.

However, chemical purity is not the lone parameter critical to the functionality and performance of high purity Nb or Nb—Ta alloys. There is a desire to have a high purity Nb or Nb—Ta product having higher purity, a fine grain size, and/or a uniform texture. Qualities such as fine grain size and homogeneous texture can be an important property for superconductor barrier sheets where formability is paramount and for sputtering targets where a uniform microstructure void of (001) localized texture bands can lead to improved uniformity of thickness of the sputtered deposited film. Further, other products containing the niobium having fine grain size can lead to improved homogeneity of deformation and enhancement of deep drawability and stretchability which are beneficial in making capacitors cans, laboratory crucibles, and increasing the lethality of explosively formed penetrators (EFP's). Uniform texture in tantalum containing products can increase sputtering efficiency (e.g., greater sputter rate) and can increase normal anisotropy (e.g., increased deep drawability), in preform products. (C. A. Michaluk, D. B. Smathers, and D. P. Field, *Proc. 12th Int. Conf. Texture of Materials*, J. A. Szpunar (ed.), National Research Council of Canada (1999) pp. 1357–1362, incorporated in its entirety by reference herein).

SUMMARY OF THE PRESENT INVENTION

A feature of the present invention relates to high purity niobium and alloys thereof.

Another feature of the present invention is to provide a high purity niobium or alloys thereof exhibiting a fine grain structure and/or uniform texture.

Another feature of the present invention is to provide articles, products, and/or components containing the high purity niobium or alloys thereof.

An additional feature of the present invention is to provide processes to make the high purity niobium and alloys thereof as well as the articles, products, and/or components containing the high purity niobium or alloys thereof.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purpose of the present invention, as embodied and broadly described herein, the present invention relates to niobium metal having a purity of at least 99.99% and more preferably at least 99.999%. The metal preferably has a fine grain structure and/or uniform texture.

The present invention further relates to an alloy containing niobium metal, wherein the niobium metal present in the alloy has a purity of at least 99.99% and more preferably at least 99.999%. The alloy (e.g., at least the niobium metal present in the alloy or mixture) also preferably has a fine grain structure and/or uniform texture.

The present invention also relates to a high purity niobium metal or alloy suitable for use as a sputtering target, having a fully recrystallized grain size with an average grain size of about 150 $\mu$m or less and/or having a primary (111)-type texture substantially throughout the thickness of the niobium metal and preferably throughout the entire thickness of the niobium metal and/or having an absence of strong (100) texture bands within the thickness of the niobium.

The present invention further relates to manufacturing plate and sheet from the above-mentioned niobium metal by flat-forging the niobium metal, machining into rolling slabs, annealing rolling slabs, rolling into plate or sheet, then annealing the plate or sheet. Final products such as sputtering targets can be then machined from the annealed plate or sheet.

The present invention also relates to a sputtering target comprising the above-described niobium metal and/or alloy. The sputtering target can also be formed, for instance, by radial forging and subsequent round processing to produce billets or slugs, which are then forged and rolled to yield discs, which can then be machined and annealed.

The present invention further relates to barrier sheets, resistive films and capacitors comprising the above-described niobium metal and/or alloy.

The present invention also relates to articles, components, or products that comprise at least in part the above-described niobium metal and/or alloy.

Also, the present invention relates to a process of making the above-described niobium metal or alloy which involves reacting a salt-containing niobium metal either with or without the presence of an alloy metal salt (e.g. $K_2TaF_7$) with pure sodium or other suitable salt in a reactive container or pot and an agitator which both are made from or have a liner comprising a metal or alloy thereof which has the same or higher vapor pressure as niobium metal at the melting point of niobium metal.

The present invention further relates to processing niobium metal powder or a blend of niobium metal and alloy powder by melting the powder in a high vacuum of $10^{-2}$ torr or more. The pressure above the melt is lower than the vapor pressures of the impurities existing in the powder melt stock. Preferably, the melting of the pure niobium or alloy metal powders are accomplished by electron beam melting.

It is to be understood that both the foregoing general description and the following detailed description are exemplary and explanatory only and are intended to provide further explanation of the present invention, as claimed.

DETAILED DESCRIPTION OF THE PRESENT INVENTION

The present invention relates to a niobium metal having a purity of at least 99.99%. Preferably, the niobium metal has a purity of at least 99.999% and can range in purity from about 99.99% to about 99.999% or more. Other ranges include about 99.998% to about 99.999% and from about 99.999% to about 99.9995% and from about 99.999% to about 99.9999%. The present invention further relates to metal alloys that contain the high purity niobium metal of the present invention, such as a Nb—Ta alloy or other alloy which contains the high purity niobium as one of the components of the alloy.

The metallic impurities that may be present in the high purity niobium metal are less than or equal to 0.01% by weight and typically comprise other body-centered cubic (bcc) refractory metals of infinite solubility in niobium, such as tantalum, molybdenum, and tungsten. Similarly, the gaseous impurities that may be present in high purity niobium metal are less than or equal to 0.20% by weight and typically comprise interstitial gases such as oxygen, nitrogen, and carbon.

The niobium metal and alloys thereof containing the niobium metal preferably have a texture that is advantageous for particular end uses, such as sputtering. In other words, when the niobium metal or alloy thereof is formed into a sputtering target having a surface and then sputtered, the texture of the niobium metal in the present invention leads to a sputtering target which is easily sputtered and, very few if any areas in the sputtering target resist sputtering. Further, with the texture of the niobium metal of the present invention, the sputtering of the sputtering target leads to a very uniform sputtering erosion thus leading to a sputtered film which is therefore uniform as well. It is preferred that the niobium having any purity, but preferably a purity of at least about 99.99%, has a grain size of about 150 microns or less. More preferably, the grain size is from about 10 microns to about 150 microns, or from about 25 microns to about 100 microns. Preferably, the niobium metal is at least partially recrystallized, and more preferably at least about 80% of the niobium metal is recrystallized and even more preferably at least about 98% of the niobium metal is recrystallized. Most preferably, the niobium metal is fully recrystallized.

Also, it is preferred that the niobium metal has a homogeneous texture through the thickness of the product. More preferably the texture is such that the (100) peak intensity within any 5% incremental thickness of the niobium is less than about 30 random, and/or has a natural log (Ln) ratio of (111):(100) center peak intensities within the same increment greater than about −4.0 (i.e., meaning, −4.0, −3.0, −2.0, −1.5, −1.0 and so on) or has both the (100) centroid intensity and the ratio. The center peak intensity is preferably from about 0 random to about 30 random, and more preferably is from about 0 random to about 15 random. Other (100) centroid intensity ranges include, but are not limited to, from about 1 random to about 10 random and from about 1 random to about 5 random. Further, the log ratio of (111):(100) center peak intensities is from about −4.0 to about 15 and more preferably from about −1.5 to about 7.0. Other suitable ranges of log ratios, include, but are not limited to, about −4.0 to about 10, and from about −3.0 to about 5.0. Most preferably, the niobium metal has the desired purity of at least about 99.99% and the preferred grain size and preferred texture with regard to the (100) incremental intensity and the (111):(100) ratio of incremental centroid intensities. The method and equipment that can be used to characterize the texture are described in Adams et al., Materials Science Forum, Vol. 157–162 (1994), pp. 31–42; Adams et al., Metallurgical Transactions A, Vol. 24A, April 1993—No. 4, pp. 819–831; Wright et al., International Academic Publishers, 137 Chaonei Dajie, Beijing, 1996 ("Textures of Material: Proceedings of the Eleventh International Conference on Textures of Materials); Wright, Journal of Computer-Assisted Microscopy, Vol. 5, No. 3 (1993), all incorporated in their entirety by reference herein.

The high purity niobium metal of the present invention can be used in a number of areas. For instance, the high purity niobium metal can be made into a barrier sheet for drawing superconductor filaments, a sputtering target, or into chemical energy (CE) munition warhead liner. The high purity metal can also be used and formed into a capacitor anode or into a resistive film layer. The niobium metal or alloy of the present invention can be used in any article or component which conventional niobium or tantalum is used and the methods and means of making the various articles or components containing the conventional niobium can be used equally here in incorporating the high purity niobium metal into the various articles or components. For instance, the subsequent processing used in making sputtering targets, such as the backing plate, described in U.S. Pat. Nos. 5,753,090, 5,687,600, and 5,522,535 can be used here and these patents are incorporated in their entirety by reference herein.

Generally, a process that can be used to make the high purity niobium metal of the present invention involves a refining process, a vacuum melting process, and a thermal mechanical process. In this process or operation, the refining process involves the steps of co-extracting the niobium metal, preferably in the form of a powder from salt containing niobium. The niobium powder, or co-reduced niobium metal and alloy powder, or a blend of niobium and elemental alloy powders, can then be subsequently vacuum melted.

After the refining process, the vacuum melting process is used to purge low melting point impurities, such as alkaline and transition metals from the niobium while consolidating the niobium material into a fully dense, malleable ingot. Preferably the niobium selected for melting has low amounts of impurities, especially, in the case of high-purity, low amounts of tantalum, molybdenum, and tungsten. More preferably, the amount of tantalum, molybdenum, and tungsten is below about 100 ppm, and most preferably is below about 10 ppm. Such a selection leads to a purer niobium cast metal. Then, after this process, a thermal mechanical process can be used which can involve a combination of cold working and annealing of the cast niobium to allow for material to recrystalize during annealing to achieve the preferred grain size and/or preferred texture in the finished product.

The high purity niobium metal preferably may be made by reacting a salt-containing niobium with at least one agent (e.g., compound or element) capable of reducing this salt to the niobium metal and further results in the formation of a slag and/or second salt in a reaction container. The reaction container can be any container typically used for the reaction of metals and should withstand high temperatures on the order of about 800° C. to about 1,200° C. For purposes of the present invention, the reaction container or the liner in the reaction container, which comes in contact with the salt-containing niobium and the agent capable of reducing the salt to niobium, is made from a material having the same or higher vapor pressure as niobium at the melting point of the niobium. The agitator in the reaction container can be made of the same material or can be lined as well. The liner can exist only in the portions of the reaction container and agitator that come in contact with the salt and niobium. Examples of such metal materials which can form the liner or reaction container include, but are not limited to, metal-based materials made from nickel, chromium, iron, manganese, titanium, zirconium, hafnium, vanadium, ruthenium, cobalt, rhodium, palladium, platinum, or any combination thereof or alloy thereof as long as the alloy material has the same or higher vapor pressure as the melting point of niobium metal. Preferably, the metal is a nickel or a nickel-based alloy, a chromium or a chromium-based alloy, or an iron or an iron-based alloy. The liner, on the reaction container and/or agitator, if present, typically will have a thickness of from about 0.5 cm to about 3 cm. Other thicknesses can be used. It is within the bounds of the present invention to have multiple layers of liners made of the same or different metal materials described above.

The salt-containing niobium can be any salt capable of having niobium contained therein such as a niobium oxide ($Nb_2O_5$). With respect to the agent capable of reducing the salt to niobium and a slag in the reaction container, the agent which is capable of doing this reduction is any agent whose reaction products have a lower free-energy of formation ($\Delta G_f$) than that of the niobium salt; for example, niobium can be formed by a thermite reaction between $Nb_2O_5$ and Al powder:

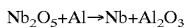

Other thermite reactants include, but are not limited to, magnesium, calcium, potassium, carbon, uranium, and thorium. With respect to the agent capable of reducing the salt to niobium and a second salt in the reaction container, the agent which is capable of doing this reduction is any agent which has the ability to result in reducing the salt-containing niobium to niobium metal and other ingredients (e.g. salt(s)) which can be separated from the niobium metal, for example, by dissolving the salts with water or other aqueous sources. Preferably, this agent is sodium. Other examples include, but are not limited to, lithium, magnesium, calcium, potassium, carbon, carbon monoxide, ionic hydrogen, and the like. Details of the reduction process which can be applied to the present invention in view of the present application are set forth in Kirk-Othmer, Encyclopedia of Chemical Technology, $3^{rd}$ Edition, Vol. 22, pp. 541–564, U.S. Pat. Nos. 2,950,185; 3,829,310; 4,149,876; and 3,767,456, all incorporated herein in their entirety by reference.

Once the niobium powder is extracted from this reaction, any impurities remaining, including any contamination from the reaction container can be removed through melting of the niobium powder. The niobium powder can be melted a number of ways such as a vacuum arc remelt and/or an electron beam melting. Generally, the vacuum during the melt will be sufficient to remove substantially any existing impurities from the recovered niobium so as to obtain high purity niobium. Preferably, the melting occurs in a high vacuum such as $10^{-4}$ torr or more. Preferably, the pressure above the melted niobium is lower than the vapor pressures of the metal impurities in order for these impurities, such as nickel and iron, to be vaporized. The diameter of the cast ingot should be as large as possible, preferably greater than 9½ inches. The large diameter assures a greater melt surface to vacuum interface that enhances purification rates. In addition, the large ingot diameter allows for a greater amount of cold work to be imparted to the metal during processing, which improves the attributes of the final products. Once the mass of melted niobium consolidates, the ingot formed will have a purity of 99.99% or higher, and preferably 99.999% or higher. The electron beam processing preferably occurs at a melt rate of from about 150 to about 400 lbs. per hour using 20,000 to 40,000 volts and 15 to 40 amps, and under a vacuum of from about $1\times10^{-3}$ to about $1\times10^{-6}$ Torr. More preferably, the melt rate is from about 200 to about 300 lbs. per hour using from 24,000 to 26,000 volts and 17 to 36 amps, and under a vacuum of from about $1\times10^{-4}$ to $1\times10^{-5}$ Torr. With respect to the VAR processing, the melt rate is preferably of 500 to 1,500 lbs. per hour using 25–50 volts and 5,000 to 22,000 amps under a vacuum of $2\times10^{-2}$ to $1\times10^{-4}$ Torr, and more preferably 900 to 1200 lbs. per hour at from 30 to 50 volts and 16,000 to 18,000 amps, and under a vacuum of from $2\times10^{-2}$ to $1\times10^{-4}$ Torr.

The high purity niobium ingot can then be thermomechanically processed to produce the high purity niobium containing product. The fine and preferably fully recrystallized grain structure and/or uniform texture is imparted to the product through a combination of cold and/or warm working and in-process annealing. The high purity niobium product preferably exhibits a uniform texture of mixed or primary (111) throughout its thickness as measured by orientation imaging microscopy (OIM) or other acceptable means. With respect to thermomechanical processing, the ingot can be subjected to rolling and/or forging processes and a fine, uniform microstructure having high purity can be obtained. The high purity niobium has an excellent fine grain size and/or a uniform distribution. The high purity niobium preferably has an average recrystallized grain size of about 150 microns or less, more preferably about 100 microns or less, and even more preferably about 50 microns or less. Ranges of suitable average grain sizes include from about 25 to about 150 microns, from about 30 to about 125 microns, and from about 30 to about 100 microns.

The resulting high purity metal of the present invention, preferably has 100 ppm or less metallic impurities and preferably 200 ppm or less $O_2$, 100 ppm or less $N_2$, and 100 ppm or less carbon. If a purity level of about 99.995 is desired, than the resulting high purity metal preferably has metallic impurities of about 50 ppm or less, and preferably 100 ppm or less $O_2$, 50 ppm or less $N_2$, and 50 ppm or less carbon.

With respect to taking this ingot and forming a sputtering target, the following process can be used. In one embodiment, the sputtering target made from the high purity niobium metal or alloy can be made by mechanically or chemically cleaning the surfaces of the niobium metal or alloy, wherein the niobium metal or alloy has a sufficient starting cross-sectional area to permit the subsequent processing steps described below. Preferably the niobium metal or alloy workpiece has a diameter of at least 9½ inches or more. The next step involves flat forging the niobium metal or alloy into one or more rolling slabs. The rolling slab(s) has a sufficient deformation to achieve substantially uniform recrystallization after the annealing step immediately following this step as described below. The rolling slab(s) is then annealed in vacuum and at a sufficient temperature to achieve at least partial recrystallization of the rolling slab(s). The rolling slab(s) is then subjected to cold or warm rolling in both the perpendicular and parallel directions to the axis of the starting metal (e.g., the niobium metal or alloy ingot) to form at least one plate. The plate is then subjected to flattening (e.g., level rolling). The plate is then annealed a final time at a sufficient temperature and for a sufficient time to have an average grain size of equal to or less than about 150 microns and a texture substantially void of (100) textural bands. Preferably, no (100) textural bands exist. The plate can then be mechanically or chemically cleaned again and formed into the sputtering target having any desired dimension. Typically, the flat forging will occur after the niobium metal is placed in air for at least about 4 hours at temperatures ranging from ambient to about 370° C. Also, preferably before cold rolling, the rolling slabs are annealed at a temperature (e.g., from about 950° C. to about 1500° C.) and for a time (e.g., from about ½ hour to about 8 hours) to achieve at least partial recrystallization of the niobium metal. Preferably the cold rolling is transverse rolling at ambient temperatures and the warm rolling is at temperatures of less than about 370° C.

With respect to annealing of the niobium plate, preferably this annealing is in a vacuum annealing at a temperature and for a time sufficient to achieve complete recrystallization of the niobium metal. The examples in this application set forth further preferred details with respect to this processing.

Another way to process the niobium metal or alloy metal into sputtering targets involves mechanically or chemically clean surfaces of the niobium metal (e.g., the niobium metal or alloy ingot), wherein the niobium metal has a sufficient starting cross-sectional area to permit the subsequent processing as described above. The next step involves round forging the niobium metal or alloy into at least one rod, wherein the rod has sufficient deformation to achieve substantially uniform recrystallization either after the annealing step which occurs immediately after this step or the annealing step prior to cold rolling. The niobium metal or alloy rod is then cut into billets and the surfaces mechanically or chemically cleaned. An optional annealing step can occur afterwards to achieve at least partial recrystallization. The billets are then axially forged into preforms. Again, an optional annealing step can occur afterwards to achieve at least partial recrystallization. However, at least one of the optional annealing steps or both are done. The preforms are then subjected to cold rolling into at least one plate. Afterwards, the surfaces of the plate(s) can be optionally mechanically or chemically clean. Then, the final annealing step occurs to result in an average grain size of about 150 microns or less and a texture substantially void of (100) textural bands, if not totally void of (100) textural bands. The round forging typically occurs after subjecting the niobium metal or alloy to temperatures of about 370° C. or lower. Higher temperatures can be used which results in increased oxidation of the surface. Preferably, prior to forging the billets, the billets are annealed. Also, the preforms, prior to cold rolling can be annealed. Preferably, these annealing temperatures will be from about 800° C. to about 1300° C. Also, any annealing is preferably vacuum annealing at a sufficient temperature and for a sufficient time to achieve recrystallization of the niobium metal or alloy.

Preferably, the sputtering targets made from the high purity niobium have the following dimensions: a thickness of from about 0.080 to about 1.50", and a surface area from about 7.0 to about 1225 square inches, though other dimensions are possible.

The high purity niobium metal or alloy preferably has a primary or mixed (111) texture, and a minimum (100) texture throughout the thickness of the sputtering target, and is sufficiently void of (100) textural bands.

The present invention will be further clarified by the following examples, which are intended to be purely exemplary of the present invention.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A process of making a sputtering target from niobium metal having a purity of at least 99.99%, comprising:
   a) mechanically or chemically cleaning surfaces of the niobium metal, wherein the niobium metal has a sufficient starting cross-sectional area to permit steps b) through g);
   b) flat forging the niobium metal into at least one rolling slab, wherein the at least one rolling slab has sufficient deformation to achieve substantially uniform recrystallization after annealing in step d);
   c) mechanically or chemically cleaning surfaces of the at least one rolling slab;
   d) annealing the at least one rolling slab at a sufficient temperature and for a sufficient time to achieve at least partial recrystallization of the at least one rolling slab;
   e) cold or warm rolling the at least one rolling slab in both the perpendicular and parallel directions to the axis of the starting niobium metal to form at least one plate;
   f) flattening the at least one plate; and
   g) annealing the at least one plate to have an average grain size equal to or less than about 150 microns and a texture substantially void of (100) textural bands.

2. The process of claim 1, wherein the niobium metal has a purity of at least 99.999%.

3. The process of claim 1, wherein the flat forging occurs after the niobium metal is placed in air for at least about 4 hours and from temperatures ranging from ambient to about 1200° C.

4. The process of claim 1, wherein the cold rolling is transverse rolling at ambient temperatures and the warm rolling is at temperatures of less than about 370° C.

5. The process of claim 1, wherein the annealing of the plate is vacuum annealing at a temperature and for a time sufficient to achieve recrystallization of the niobium metal.

6. A process of making a sputtering target from niobium metal having a purity of at least 99.995%, comprising:
   a) mechanically or chemically cleaning surfaces of the niobium metal, wherein the niobium metal has a sufficient starting cross-sectional area to permit steps b) through i);
   b) round forging the niobium metal into at least one rod, wherein the at least one rod has sufficient deformation to achieve substantially uniform recrystallization after annealing in step d) or step f);
   c) cutting the rod into billets and mechanically or chemically cleaning the surfaces of the billets;
   d) optionally annealing the billets to achieve at least partial recrystallization;
   e) axially forging billets into preforms;
   f) optionally annealing the preforms to achieve at least partial recrystallization;
   g) cold rolling the preforms into at least one plate; and
   h) optionally mechanically or chemically cleaning the surfaces of the at least one plate; and
   i) annealing the at least one plate to have an average grain size equal to or less than about 150 microns and a texture substantially void of (100) textural bands, wherein annealing occurs at least in step d) or f) or both.

7. The process of claim 6, wherein the niobium metal has a purity of at least 99.999%.

8. The process of claim 6, wherein the round forging occurs after subjecting the niobium metal to temperatures of about 370° C. or lower.

9. The process of claim 6 wherein prior to forging the billets, the billets are annealed.

10. The process of claim 6, wherein prior to cold rolling of the preforms, the preforms are annealed.

11. The process of claim 6, wherein the annealing of the preforms is vacuum annealing at a sufficient temperature and for a time to achieve recrystallization.

12. A niobium sputtering component comprising an average grain size of about 25 microns or less and a uniform texture of primary (111) throughout a thickness of the component.

13. The niobium sputtering component of claim 12, wherein said niobium sputtering component is a sputtering target.

14. The niobium sputtering component of claim 12, wherein said niobium sputtering component has 50 ppm or less metallic impurities.

15. The niobium sputtering component of claim 12, further having 100 ppm or less $O_2$, 50 ppm or less $N_2$, or 50 ppm or less carbon, or combinations thereof.

16. The niobium sputtering component of claim 12, having 100 ppm or less metallic impurities.

17. The niobium sputtering component of claim 12, further having 200 ppm or less $O_2$, 100 ppm or less $N_2$, or 100 ppm or less carbon, or combinations thereof.

18. The niobium sputtering component of claim 12, wherein said niobium sputtering comprises niobium having a purity of at least 99.99% niobium.

19. The niobium sputtering component of claim 12, wherein said niobium sputtering component comprises niobium having a purity of at least 99.995% niobium.

20. The niobium sputtering component of claim 12, wherein said niobium sputtering component comprises niobium having a purity of at least 99.999% niobium.

21. The niobium sputtering component of claim 12, wherein said niobium sputtering component is fully recrystallized.

22. The niobium sputtering component of claim 12, wherein said niobium sputtering component is at least partially recrystallized.

23. The niobium sputtering component of claim 12, wherein about 98% or more of said niobium sputtering component is recrystallized.

24. The niobium sputtering component of claim 12, wherein about 80% or more of said niobium sputtering component is recrystallized.

25. The niobium sputtering component of claim 12, having a purity of from 99.995% to about 99.999%.

26. A niobium sputtering component comprising an average grain size of about 25 microns or less and a uniform texture of mixed (111) throughout its thickness, which is substantially void of (100) textural bands.

27. The niobium sputtering component of claim 26, wherein said niobium sputtering component is a sputtering target.

28. The niobium sputtering component of claim 26, wherein said niobium sputtering comprises niobium having a purity of at least 99.99% niobium.

29. The niobium sputtering component of claim 26, wherein said niobium sputtering component comprises niobium having a purity of at least 99.995% niobium.

30. The niobium sputtering component of claim 26, wherein said niobium sputtering component comprises niobium having a purity of at least 99.999% niobium.

31. The niobium sputtering component of claim 26, wherein said niobium sputtering component is fully recrystallized.

32. The niobium sputtering component of claim 26, wherein said niobium sputtering component is at least partially recrystallized.

33. The niobium sputtering component of claim 26, wherein about 98% or more of said niobium sputtering component is recrystallized.

34. The niobium sputtering component of claim 26, wherein about 80% or more of said niobium sputtering component is recrystallized.

35. A niobium sputtering component comprising a mixed (111)-type texture throughout its thickness which is substantially void of (100) textural bands, wherein said niobium sputtering component has an average grain size of about 25 microns or less and wherein said niobium sputtering component has a purity of at least 99.99% niobium.

36. The niobium sputtering component of claim 35, wherein said niobium sputtering component is a sputtering target.

37. The niobium sputtering component of claim 35, wherein said niobium sputtering component comprises niobium having a purity of at least 99.995% niobium.

38. The niobium sputtering component of claim 35, wherein said niobium sputtering component comprises niobium having a purity of at least 99.999% a niobium.

39. The niobium sputtering component of claim 35, wherein said niobium sputtering component is fully recrystallized.

40. The niobium sputtering component of claim 35, wherein said niobium sputtering component is at least partially recrystallized.

41. The niobium sputtering component of claim 35, wherein about 98% or more of said niobium sputtering component is recrystallized.

42. The niobium sputtering component of claim 35, wherein about 80% or more of said niobium sputtering component is recrystallized.

43. The niobium sputtering component of claim 12, further comprising a backing plate.

44. The niobium sputtering component of claim 26, further comprising a backing plate.

45. The niobium sputtering component of claim 35, further comprising a backing plate.

46. A process of making a sputtering component from niobium metal, comprising:
   a) mechanically or chemically clean surfaces of the niobium metal, wherein the niobium metal has a sufficient starting cross-sectional area to permit steps b) through g);
   b) flat forging the niobium metal into at least one rolling slab, wherein the at least one rolling slab has sufficient deformation to achieve substantially uniform recrystallization after annealing in step d);
   c) mechanically or chemically clean surfaces of the at least one rolling slab;
   d) annealing the at least one rolling slab at a sufficient temperature and for a sufficient time to achieve at least partial recrystallization of the at least one rolling slab;
   e) cold or warm rolling the at least one rolling slab in both the perpendicular and parallel directions to the axis of the starting niobium metal to form at least one plate;
   f) flattening the at least one plate; and
   g) annealing the at least one plate to have an average grain size equal to or less than about 100 microns and a texture substantially void of (100) textural bands.

47. The process of claim 46, wherein said niobium sputtering component is a sputtering target.

48. The process of claim 46, wherein the flat forging occurs after the niobium metal is placed in air for at least about 4 hours and from temperatures ranging from ambient to about 1200° C.

49. The process of claim 46, wherein the cold rolling is transverse rolling at ambient temperatures and the warm rolling is at temperatures of less than about 370° C.

50. The process of claim 46, wherein the annealing of the plate is vacuum annealing at a temperature and for a time sufficient to achieve recrystallization of the niobium metal.

51. A process of making a sputtering component from niobium metal, comprising:
   a) mechanically or chemically clean surfaces of the niobium metal, wherein the niobium metal has a sufficient starting cross-sectional area to permit steps b) through i);
   b) round forging the niobium metal into at least one rod, wherein the at least one rod has sufficient deformation to achieve substantially uniform recrystallization after annealing in step d) or step f);
   c) cutting the rod into billets and mechanically or chemically clean the surfaces of the billets;
   d) optionally annealing the billets to achieve at least partial recrystallization;
   e) axially forging billets into preforms;
   f) optionally annealing the preforms to achieve at least partial recrystallization;
   g) cold rolling the preforms into at least one plate; and
   h) optionally mechanically or chemically clean the surfaces of the at least one plate; and
   i) annealing the at least one plate to have an average grain size equal to or less than about 100 microns and a texture substantially void of (100) textural bands, wherein annealing occurs at least in step d) or f) or both.

52. The process of claim 51, wherein said niobium sputtering component is a sputtering target.

53. The process of claim 51, wherein the round forging occurs after subjecting the niobium metal to temperatures of about 370° C. or lower.

54. The process of claim 51, wherein prior to forging the billets, the billets are annealed.

55. The process of claim 51, wherein prior to cold rolling of the preforms, the preforms are annealed.

56. The process of claim 51, wherein the annealing of the preforms is vacuum annealing at a sufficient temperature and for a time to achieve recrystallization.

57. A process of making a sputtering component comprising round forging niobium metal into at least one rod;

annealing said at least one rod;

forging said at least one rod into at least one preform;

annealing said at least one preform;

rolling said at least one preform; and annealing afterwards.

58. The process of claim 57, wherein said niobium sputtering component is a sputtering target.

59. The process of claim 57, wherein said forging is axially.

60. The process of claim 57, wherein said rolling is cold rolling.

61. A process of making a sputtering component comprising;

radial forging a niobium metal;

forging said niobium metal after radial forging;

rolling said niobium metal; and annealing said niobium metal.

62. The process of claim 61, wherein said niobium sputtering component is a sputtering target.

63. The process of claim 61, wherein said sputtering component has no textural (100) bands.

64. The process of claim 61, wherein said sputtering component has a uniform texture of mixed or primary (111) throughout the thickness of the sputtering component.

65. A process of making a sputtering component comprising flat forging a niobium metal;

annealing said niobium metal;

rolling said niobium metal into a plate or sheet;

annealing said plate or sheet to achieve a niobium metal having no textural (100) bands, wherein said sputtering component has a purity of at least 99.99% niobium or an average grain size of about 25 microns or less.

66. The process of claim 65, wherein said niobium sputtering component is a sputtering target.

67. The process of claim 65, wherein said process further comprises flattening said niobium metal after the last anneal and then annealing again.

68. A process of making a sputtering component comprising a combination of cold and/or warm working of a niobium metal and in-process annealing to obtain a uniform texture of mixed or primary (111) throughout the thickness of the niobium metal, wherein said sputtering component has a purity of at least 99.99% niobium or an average grain size of about 25 microns or less or both.

69. The process of claim 68, wherein said niobium sputtering component is a sputtering target.

70. The process of claim 68, wherein said cold and/or warm working comprises subjecting said niobium metal to rolling and/or forging processes.

71. The process of claim 68, wherein said niobium metal has a purity of at least 99.99% niobium.

72. The process of claim 68, wherein said niobium metal has a purity of at least 99.995% niobium.

73. The process of claim 68, wherein said niobium metal has a purity of at least 99.999% niobium.

74. The process of claim 65, wherein the annealing of said plate or sheet is at a temperature of about 800–1300° C.

75. The process of claim 57, wherein the annealing after said rolling is at a temperature of 950°–1050° C.

76. The niobium sputtering component of claim 12, wherein the combined amount of tantalum, molybdenum, and tungsten is below about 100 ppm.

77. The niobium sputtering component of claim 12, wherein the combined amount of tantalum, molybdenum, and tungsten is below about 10 ppm.

78. The niobium sputtering component of claim 26, wherein the combined amount of tantalum, molybdenum, and tungsten is below about 100 ppm.

79. The niobium sputtering component of claim 26, wherein the combined amount of tantalum, molybdenum, and tungsten is below about 10 ppm.

80. The niobium sputtering component of claim 35, wherein the combined amount of tantalum, molybdenum, and tungsten is below about 100 ppm.

81. The niobium sputtering component of claim 35, wherein the combined amount of tantalum, molybdenum, and tungsten is below about 10 ppm.

* * * * *